(12) United States Patent
Yoo

(10) Patent No.: US 7,198,677 B2
(45) Date of Patent: Apr. 3, 2007

(54) LOW TEMPERATURE WAFER BACKSIDE CLEANING

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 0 days.

(21) Appl. No.: 11/075,676

(22) Filed: Mar. 9, 2005

(65) Prior Publication Data

US 2006/0201623 A1    Sep. 14, 2006

(51) Int. Cl.
*C23C 16/00* (2006.01)

(52) U.S. Cl. ............... 118/715; 118/723 R; 156/345.23

(58) Field of Classification Search ............... 118/728, 118/500; 156/345.4–345.51; 361/234; 279/128; 269/21
See application file for complete search history.

(56) References Cited

U.S. PATENT DOCUMENTS

| | | | | |
|---|---|---|---|---|
| 5,595,627 A * | 1/1997 | Inazawa et al. | ............. | 438/715 |
| 5,660,673 A * | 8/1997 | Miyoshi | ................ | 156/345.51 |
| 5,972,114 A * | 10/1999 | Yonenaga et al. | .......... | 118/715 |
| 6,176,969 B1 * | 1/2001 | Park et al. | ............. | 156/345.29 |
| 6,178,919 B1 * | 1/2001 | Li et al. | ................ | 118/723 E |
| 6,444,027 B1 * | 9/2002 | Yang et al. | ................ | 117/200 |
| 6,506,685 B2 * | 1/2003 | Li et al. | ..................... | 438/710 |
| 6,527,911 B1 * | 3/2003 | Yen et al. | .............. | 156/345.43 |
| 6,599,367 B1 * | 7/2003 | Nakatsuka | .................. | 118/715 |
| 6,676,803 B2 * | 1/2004 | Kim | ..................... | 156/345.47 |
| 6,805,135 B1 * | 10/2004 | Hirota et al. | .................. | 134/2 |
| 6,837,966 B2 * | 1/2005 | Nishimoto et al. | .... | 156/345.29 |
| 6,963,043 B2 * | 11/2005 | Fink | ..................... | 219/121.43 |
| 2003/0037880 A1 * | 2/2003 | Carducci et al. | ........ | 156/345.43 |
| 2004/0083976 A1 * | 5/2004 | Meyyappan | ................ | 118/728 |
| 2005/0098265 A1 * | 5/2005 | Fink et al. | ............. | 156/345.51 |
| 2005/0103268 A1 * | 5/2005 | Nishimoto et al. | ......... | 118/715 |

FOREIGN PATENT DOCUMENTS

WO    WO 99/50473    * 10/1999

* cited by examiner

*Primary Examiner*—Sylvia R. MacArthur
(74) *Attorney, Agent, or Firm*—MacPherson, Kwok, Chen & Heid LLP; Tom Chen

(57) ABSTRACT

A ring is provided that, together with a wafer, separates a processing chamber into an upper portion and a lower portion so that one side of the wafer, such as the backside, can be cleaned or otherwise processed with little or no interaction to the frontside of the wafer. The wafer sits on pins extending from a plate so that processor cleaning gases can contact the surface of the wafer backside. In one embodiment, the ring is conductive, with an inner insulating ring, and the place is also conductive. The conductive plate and ring act as electrodes for plasma generation underneath the wafer.

8 Claims, 2 Drawing Sheets

LOW TEMPERATURE WAFER BACKSIDE CLEANING

BACKGROUND

1. Field of Invention

This invention generally relates to semiconductor manufacturing and, more particularly, to a structure and method for cleaning the backside of a wafer.

2. Related Art

During manufacture of a semiconductor device, a wafer, such as a silicon wafer, is processed in a processing chamber. Different processing steps include depositing, patterning, and etching layers of various materials over the silicon wafer. However, processing may introduce contaminants in the processing environment, which can adversely affect the quality of deposited layer(s) or resulting device. For example, dust or etched material may come in contact with the surface of the wafer, which could interfere with the deposition of a layer by causing imperfections in the layer, as well as interfere with the photolithography or etching steps.

Consequently, the frontside (surface facing up into the processing chamber) and backside (surface facing down) of the wafer needs to be cleaned throughout the processing. Cleaning removes impurities and other unwanted material from the wafer surface to improve the quality of subsequent processing steps.

In conventional processes, the frontside of the wafer is cleaned, such as with HCl, $ClF_3$, $NF_3$ or other traditional cleaning gases. The wafer is then turned over to clean the backside. However, this results in additional steps, time, and complexity. Additional steps are needed to protect the frontside of the wafer while the backside is being cleaned, such as the application and removal of protective layers on the frontside. Also, additional handling of the wafer increases the likelihood of damage to the wafer.

Therefore, there is a need for cleaning the backside of a wafer that overcomes the disadvantages of conventional techniques discussed above.

SUMMARY

According to one aspect of the present invention, a ring about the wafer separates the front side of the wafer in an upper portion of the processing chamber and the backside of the wafer in a lower portion of the chamber. As a result, process gases introduced in the lower portion of the chamber are essentially isolated to the backside of the wafer. Cleaning of the wafer backside can then be accomplished, using methods such as light (photons) or plasma.

In one embodiment, the ring has small holes to equalize pressure between the upper and lower portions of the chamber. The holes are small enough so that there is little or no interaction between the upper and lower portions. In one embodiment, the size of the holes is approximately one-fourth of the wavelength or less. The ring is made of a conducting material, such as metal, with a non-conductive lip or ledge along the inner circumference to electrically isolate the wafer from the outer portions of the ring. The ring can then be used as an electrode for plasma generation. Another electrode can be a conductive plate with insulating pins protruding therefrom, where the plate and pins support the wafer in the processing chamber. A plasma can then be generated which is localized within the volume between the backside of the wafer and the conductive plate. Voltage can then be applied to both electrodes to generate the plasma about the backside of the wafer for cleaning. The wafer sits on the pins so that the backside is exposed and cleaning can occur.

These and other features and advantages of the present invention will be more readily apparent from the detailed description of the preferred embodiments set forth below taken in conjunction with the accompanying drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
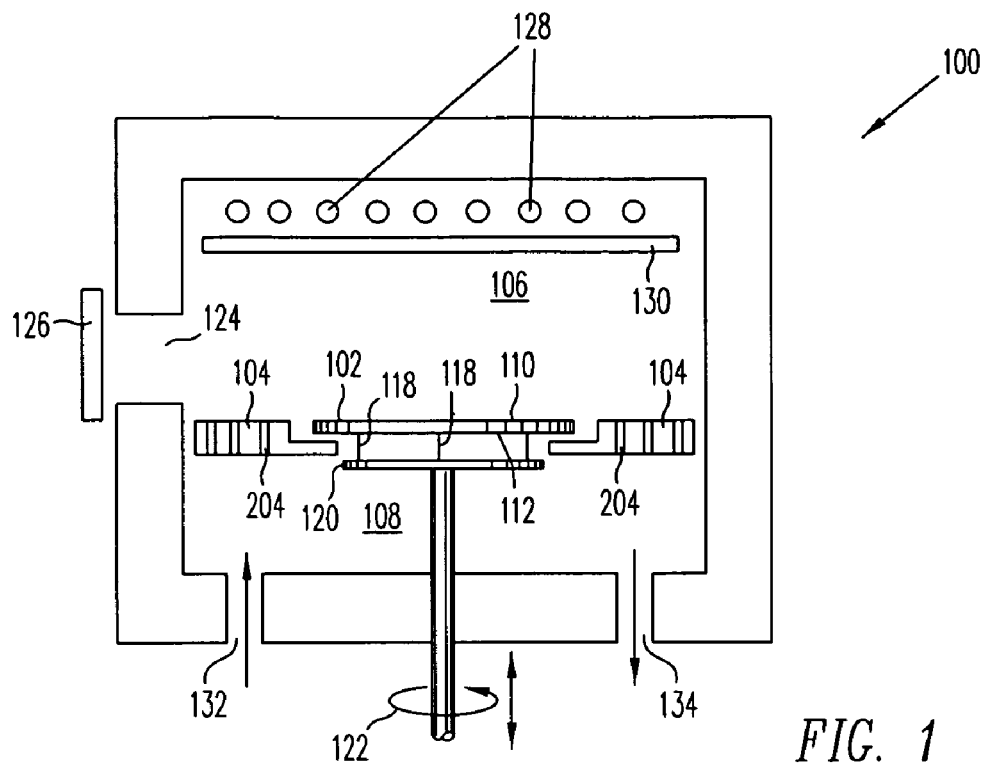
FIG. 1 is a side view of a wafer processing chamber with a ring according to one embodiment of the present invention for processing, and more specifically, cleaning the backside of, a wafer.

FIG. 1 is a side view of a wafer processing chamber 100 for processing a wafer 102 has a ring 104 according to one embodiment of the present invention. Ring 104 operates to effectively separate the volume of the interior of chamber 100 into an upper portion 106 and a lower portion 108. Wafer 102 has a frontside 110 and a backside 112, with frontside 110 exposed to upper portion 106 and backside 112 exposed to lower portion 108. By separating the exposure area of the backside from the frontside, desired processing gases can be introduced into chamber 100 for specific frontside or backside processing. As a result, the backside of wafer 102 can be cleaned without the cleaning gases significantly affecting the frontside. This enables more efficient cleaning at lower temperatures that with conventional methods.

Figure 2:
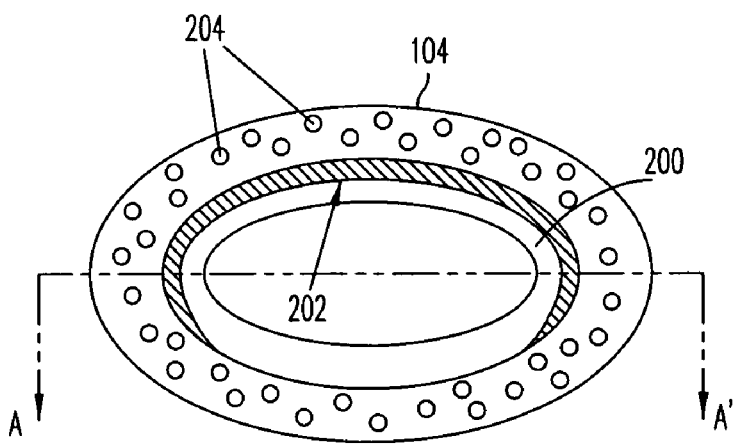
FIG. 2 is a perspective view of the ring of FIG. 1 according to one embodiment of the present invention.
Figure 3:
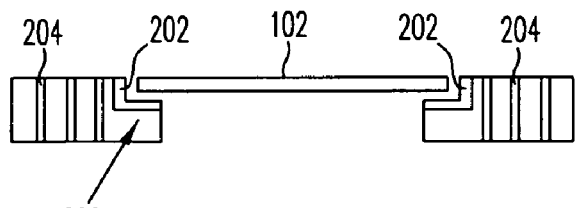
FIG. 3 is a cross-sectional view of the ring of FIG. 2 along sectional line A–A'.

FIG. 2 is a perspective view of ring 104 according to one embodiment of the present invention, and FIG. 3 is a cross-sectional view of ring 104 along sectional line A–A' of FIG. 2. Ring 104 has a "lip" or ledge 200 along the inner circumference of the ring for supporting wafer 102. The radius to the inner circumference or of the hole can be of different sizes, depending on the size of the wafer. The width of ledge 200 is sufficient to support wafer 102. In one embodiment, the radius of the hole is approximately 2 to 10 mm smaller than the radius of the wafer, resulting in ledge 200 having a width of approximately 2 to 10 mm, with the actual width dependent on factors, such as edge exclusion. Ledge 200 is approximately 1 to 5 mm deep in one embodiment, resulting in the frontside of the wafer being approximately co-planar or below the upper surface of ring 104. The total thickness or height of ring 104 is approximately 3 to 10 mm in one embodiment. Ring 104 can be made of a conductive material, such as metal, and includes a non-conductive inner portion 202, such as a quartz or ceramic ring. The non-conductive portion acts to electrically isolate the wafer from the conductive portions of the ring, as will be discussed in more detail below.

Ring 104 also has small holes 204 dispersed throughout the ring, which enables pressure in the upper portion and the lower portion of the chamber to be substantially balanced or equalized. If the pressure difference is too great between the upper and lower portions, the wafer may bend, break, or otherwise become damaged. Holes 204 should be small enough to prevent significant interaction between the upper and lower portions. However, holes 204 should also be large enough to sufficiently equalize the pressure between the upper and lower portions. In one embodiment, the size of the holes depends on the wavelength of the ions of the processing gas or plasma, e.g., a diameter of approximately ¼ the wavelength. For example, holes 204 are between approximately 0.5 and 3.0 mm in diameter. As those skilled in the art will appreciate, thicker rings will reduce the conductance of the same diameter of holes.

Referring back to FIG. 1, wafer 102 is supported by non-conductive or insulating pins 116 on the upper surface of a susceptor or conducting plate 120. The backside 112 of wafer 102 contacts pins 116. As used herein, "backside" refers to the non-polished side of the wafer, while the "frontside" of the wafer refers to that surface of the wafer which is normally polished to provide a very flat surface to facilitate subsequent formation of integrated circuit structures thereon. Ring 104 is positioned approximately on the same plane as wafer, such that ring 104 and wafer 102 substantially span the length and width of the interior of chamber 100. The ring can be placed on ledges attached to the chamber wall or lips on the chamber wall. Holes 204 through ring 104 equalize the pressure in upper portion 106 and lower portion 108 within 10 Torr in one embodiment.

Conducting plate 120 is attached to a movable and rotatable rod 122. Rod 122 moves up and down to load and unload wafer into and from the interior of chamber 100 through an opening. An opening 124 to process chamber 100 is sealable by a gate valve 126. Gate valve 126 is operable to seal opening 124, such as during wafer processing, and to uncover opening 124, such as during wafer transfer into and out of chamber 100. Robot assemblies or other mechanisms (not shown) can be used to transfer wafer 102, such as from a wafer cassette, to and from the process chamber. Rod 122 also rotates to enable uniform decomposition of gases and etching during the various semiconductor manufacturing steps. Rod 122 can be connected to a lowering and raising means such as a fluid power cylinder or a motor to raise and lower conducting plate 120.

In one embodiment, chamber 100 includes lamps 128, such as tungsten lamps, along an upper section of the chamber. A light transparent window 130 between lamps 128 and wafer 102 allows light energy or photons from lamps 128 to heat wafer 102. Light, either filtered or unfiltered, is passed to wafer 102 during processing. Accordingly, window 130 can be a filtering window or a non-filtering window, made of materials such as quartz and ZnSe. Heat source can be any suitable wafer heating source, such as a susceptor, hot plate, or lamps. Lamps may be a single lamp or an array of individual lamps, positioned at distances both from the wafer and from each other to uniformly heat the overlying wafer.

Along a lower section of the chamber, a gas inlet 132 is coupled to a gas source (not shown) to allow various process gases to be introduced into the chamber. A gas outlet or exhaust 134, also along a lower section of the chamber, purges gas from the chamber. Process gases can be conventional cleaning or etching gases used for plasma etching.

Note that gas inlets and outlets may also be located along the upper portion of the chamber or along both portions, depending on desired use and applications.

Figure 4:
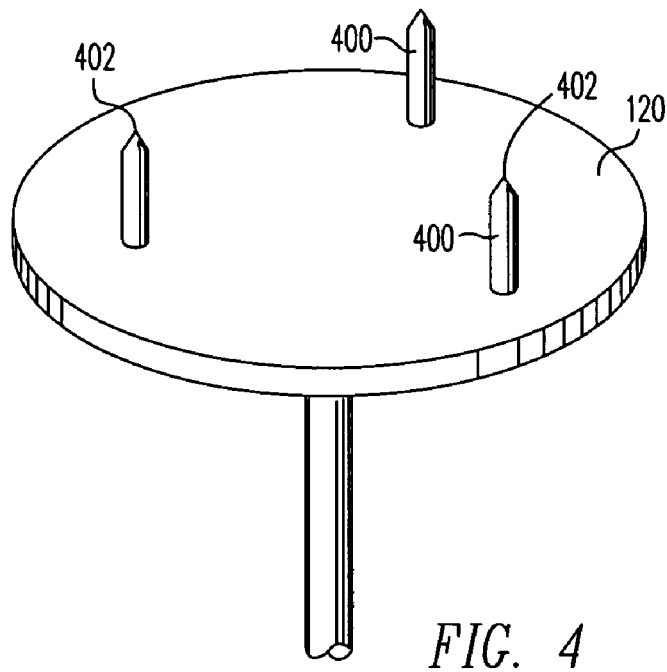
FIG. 4 shows the conducting plate of FIG. 1 with pins that protrude upwardly from the surface of plate to support the wafer according to one embodiment.

In one embodiment of the present invention, plasma etching is used to etch the wafer backside. Conducting plate 120 acts as one conductive cathode for generating the plasma. FIG. 4 shows conducting plate 120 with pins 400 that protrude upwardly from the surface of plate 120 to support wafer 102. In one embodiment, the backside of wafer 102 is between approximately 0.25 inches and 1 inch from the surface of plate 110 to allow the plasma to contact and clean the wafer backside. Pins 400 have pointed ends 402, in one embodiment, to engage the bottom surface of wafer 102 while contacting only a very small surface area of the wafer backside. As a result, more of the wafer backside is exposed during a cleaning process. FIG. 4 shows three equally pins 400, although, as those skilled in the art will appreciate, different numbers and configurations of pins can be used. However, a minimum of three pins is required to adequately support wafer 102. Pins 400 may be made of any material which will not interfere with the processing of wafer 102, such as a non-conductive or dielectric material.

Plasma for the clean or etch is generated using conventional power generating equipment and methods. In one embodiment, voltage, such as AC, DC, or RF, is applied to conducting plate 120 and to ring 104 to generate a localized plasma between wafer 102 and plate 120. Suitable pressures for the chamber are 0.001 mTorr to approximately 100 Torr. At pressures of approximately 100 Torr and less, a relatively uniform plasma can be generated with little or no streaking. In one embodiment, the pressure is 50 Torr and less.

Referring to FIG. 1, cleaning or etching gases are introduced into chamber through gas inlet 132. Suitable process gases capable of plasma etching or cleaning include gases capable of generating fluorine or chlorine radicals which will then react with the wafer backside to remove such unwanted material or contaminants. Examples of such process gases include $NF_3$, $SF_6$, $CF_4$, $C_2F_6$, HCl, $ClF_3$, $SF_6$, $CCl_2F_2$, $C_2Cl_2F_4$, $BCl_3$, $SCl_4$, $Cl_2$, $C_3H_8$, $C_2H_6$, $CCl_4$, $CBrF_3$, $CF_2Cl_2$, and $CH_2F_2$. When more than one gas is flowing into the chamber, the mixture of gases may further include inert or non-reactive gases such as argon, neon, or helium. Once the processing or cleaning is completed, the gases can be purged from the chamber through gas outlet 134 (FIG. 1).

Temperature range from room temperature to approximately 600° C. The temperature in the chamber may be controlled by the temperature of the gas which is flowed into the chamber or other suitable means. The time period and the power level of the plasma depend on various factors, such as the power levels, amount of cleaning needed, type of material to be cleaned, temperature, and gap size between the conducting plate and the wafer backside.

In another embodiment, light or photons are used to clean the backside of the wafer. As discussed above, ring 104 isolates process or cleaning gases to the bottom portion of the chamber for cleaning the wafer backside. With just light, the rate of reaction can be slow. Consequently, heat can be applied, such as with lamps 128 or other thermal sources. Suitable lamps include halogen lamps, mercury lamps, xenon lamps, argon lamps, krypton lamps, and cadmium lamps. The choice of the heat source depends on various factors, including desired light energy. For example, tungsten halogen lamps can be used to provide visible and infrared light. Mercury (Hg) lamps, at low, medium, or high pressure, gives spectral lines, but with different intensity ratio. Lamp activation and operation can be by any suitable conventional method.

Figure 5:
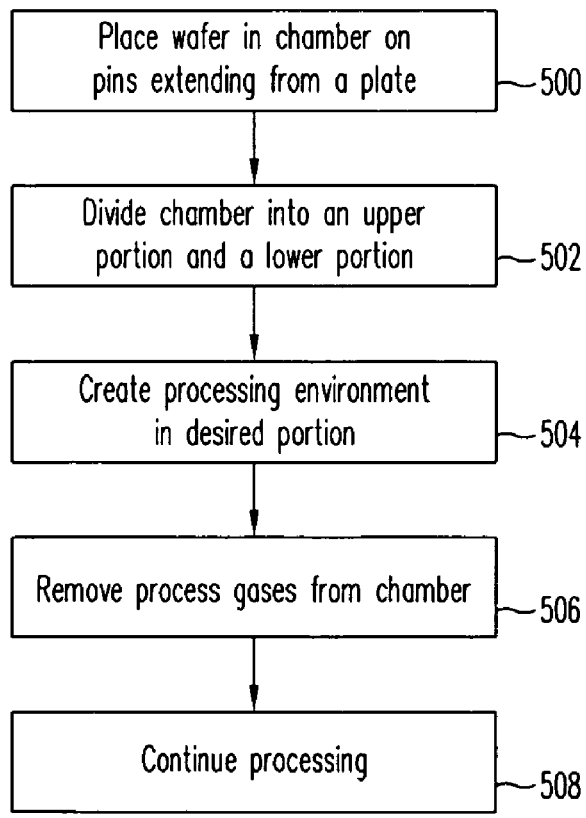
FIG. 5 is a flowchart showing a process for cleaning the backside of a wafer according to one embodiment of the present invention.

FIG. 5 is a flowchart showing steps for cleaning the backside of a wafer according to one embodiment of the present invention. In step 500, a wafer to be processed or cleaned is inserted into a process chamber. In one embodiment, the wafer is placed on a plate having pins protruding thereon. The pins provide separation between the wafer backside and the underlying plate to enable backside cleaning. The chamber is then divided, such as with a conducting ring along the same plane as the wafer, in step 502. The division separates the chamber into an upper portion into which the frontside of the wafer faces and a lower portion into which the backside of the wafer faces. Next, a balancing or equalization means is provided so that when process gases are introduced into either the upper portion or the lower portion of the chamber, a large mismatch of pressures does not occur. In one embodiment, the equalization means is a series of through holes in the ring. The holes are large enough to enable pressure balancing, but not so large that process gas interactions begin occurring in the separated portion.

In step 504, a processing environment is created in the desired portion of the chamber. In one embodiment, wafer backside cleaning is performed, such that cleaning or etching gases are introduced into the lower portion of the chamber. Any suitable conventional cleaning or etching gases or process can be used, such as a plasma clean or a cleaning process using light energy. For a plasma clean, a plasma can be generated by applying a voltage to two electrodes to ignite a plasma localized underneath the wafer backside. In one embodiment, one electrode is the ring and the other electrode is the underlying plate, as discussed above. After cleaning, the gases are removed from the chamber in step 506, such as through a gas exhaust or outlet. Further processing can then continue in step 508 or the wafer can be removed.

The above-described embodiments of the present invention are merely meant to be illustrative and not limiting. For example, the ring was described as being circular, both along an inner radius and along the circumference. However, other shapes for the ring may also be suitable, depending on various factors, such as the shape of the chamber interior. Also, even though backside cleaning was described in detail, the present invention can also be used for wafer frontside cleaning due to the capability of limiting the process gases to the frontside or the backside of a wafer. It will thus be obvious to those skilled in the art that various changes and modifications may be made without departing from this invention in its broader aspects. Therefore, the appended claims encompass all such changes and modifications as fall within the true spirit and scope of this invention.

What is claimed is:

1. A wafer processing system comprising:
   a process chamber;
   a wafer support for supporting a wafer during processing;
   a gas inlet for introducing process gases into the chamber;
   an electrically conductive ring surrounding the wafer support and in approximately the same plane as the wafer, wherein the ring separates the chamber into an upper portion and a lower portion, the ring comprising a recessed inner ledge on the same plane as the wafer and extending under the wafer to support the wafer and an outer ring portion thicker than the inner ledge, wherein the ring has a plurality of holes located in the outer ring portion and outside the inner ledge and the outer circumference of the wafer to allow a balancing of pressure between the upper and lower portions; and
   a non-electrically conductive inner ring between the inner ledge and the wafer to support the wafer; wherein the shape of the inner ring substantially corresponds to the shape of the recessed inner ledge.

2. The wafer processing system of claim 1, wherein the holes are approximately 0.5 to 3.0 mm in diameter.

3. The wafer processing system of claim 1, wherein the gas inlet is located along a bottom portion of the chamber.

4. The wafer processing system of claim 1, wherein the wafer support comprises a plate and pins extending from the surface of the plate.

5. The wafer processing system of claim 4, wherein the plate is electrically conductive and the pins are non-electrically conductive.

6. A ring for separating a wafer process chamber into an upper portion and a lower portion, the ring comprising:
   a circular hole approximately the size of the wafer;
   a substantially conductive planar portion extending outward from the hole to the walls of the process chamber;
   a conductive recessed inner ledge on the same plane as the wafer between the hole and the substantially conductive planar portion extending under the wafer for supporting the wafer, wherein the inner ledge is thinner than the planar portion;
   a non-electrically conductive inner ring between the inner ledge and the wafer; wherein the shape of the inner ring substantially corresponds to the shape of the recessed inner ledge and
   a plurality of holes located throughout the substantially planar portion and outside the inner ledge and the outer circumference of the wafer.

7. The ring of claim 6, where the substantially planar portion is approximately 3 to 10 mm thick.

8. The ring of claim 6, wherein the substantially planar portion has a circular outer circumference.

* * * * *

UNITED STATES PATENT AND TRADEMARK OFFICE
CERTIFICATE OF CORRECTION

PATENT NO. : 7,198,677 B2 Page 1 of 1
APPLICATION NO. : 11/075676
DATED : April 3, 2007
INVENTOR(S) : Woo Sik Yoo It is certified that error appears in the above-identified patent and that said Letters Patent is hereby corrected as shown below:

Column 2, Line 46:

Delete "that" and insert --than--

Signed and Sealed this

First Day of July, 2008

JON W. DUDAS
*Director of the United States Patent and Trademark Office*